United States Patent [19]
Kakamu et al.

[11] Patent Number: 5,985,519
[45] Date of Patent: Nov. 16, 1999

[54] METHOD OF MANUFACTURING SEMICONDUCTOR DEVICE USING TOP ANTIREFLECTION FILM

[75] Inventors: Yoko Kakamu; Yuichiro Yanagishita, both of Kawasaki, Japan

[73] Assignee: Fujitsu Limited, Kawasaki, Japan

[21] Appl. No.: 08/960,314

[22] Filed: Oct. 29, 1997

[30] Foreign Application Priority Data

Mar. 19, 1997 [JP] Japan .................................... 9-066791

[51] Int. Cl.⁶ ...................................................... G03F 7/20
[52] U.S. Cl. ........................................... 430/313; 430/950
[58] Field of Search .................................. 430/311, 313, 430/30, 950

[56] References Cited

U.S. PATENT DOCUMENTS

| | | | |
|---|---|---|---|
| 5,541,037 | 7/1996 | Hatakeyama et al. | 430/325 |
| 5,545,588 | 8/1996 | Yoo | 437/187 |
| 5,554,486 | 9/1996 | Garza | 430/311 |
| 5,554,489 | 9/1996 | Ishibashi et al. | 430/950 |
| 5,656,128 | 8/1997 | Hashimoto et al. | 430/318 |
| 5,688,365 | 11/1997 | Ogoshi | 216/47 |
| 5,698,352 | 12/1997 | Ogawa et al. | 430/950 |
| 5,750,316 | 5/1998 | Kawamura et al. | 430/311 |

*Primary Examiner*—Kathleen Duda
*Attorney, Agent, or Firm*—Armstrong, Westerman, Hattori, McLeland & Naughton

[57] ABSTRACT

A method of manufacturing a semiconductor device for patterning a semiconductor substrate by photolithography, the semiconductor substrate having a transparent or semitransparent layer having a high transmissivity at an exposure wavelength $\lambda$, and the transparent or semitransparent layer being formed on an underlying structure with a surface having a high reflectivity at the exposure wavelength $\lambda$. The method comprises the steps of: forming a resist layer having a refractive index $n_r$ and a thickness $d_r$ on the transparent or semitransparent layer; forming a top antireflection film having a refractive index $n_a$ and a thickness $d_a$ on the resist layer; selectively exposing the resist layer via the top antireflection film with light having the exposure wavelength $\lambda$; removing the top antireflection film; and developing a latent image in the resist layer to form a resist pattern, wherein an optical thickness $n_a d_a$ of the top antireflection film and an optical thickness $n_r d_r$ of the resist layer are selected so that a size change in the resist pattern becomes small even if the thickness of the transparent or semitransparent layer changes. This method provides an excellent size precision in patterning a transparent or semitransparent layer formed on a high reflectivity surface.

12 Claims, 8 Drawing Sheets

METHOD OF MANUFACTURING SEMICONDUCTOR DEVICE USING TOP ANTIREFLECTION FILM

This application is based on Japanese Patent Application No. 9-66791 filed on Mar. 19, 1997, the entire contents of which are incorporated herein by reference.

BACKGROUND OF THE INVENTION a) Field of the Invention

The present invention relates to a method of manufacturing a semiconductor device, and more particularly to a method of manufacturing a semiconductor device including an exposure process of a resist layer covered with a top antireflection coating or film.

b) Description of the Related Art

Highly integrated semiconductor devices have necessarily fine semiconductor elements formed therein. For improving resolution, an exposure wavelength used for photolithography patterning is becoming shorter. If the layer under a resist layer has a high reflectivity, the intensity of exposure light being incident on and reflected from the underlying layer during photolithography becomes high and the intensity of light internally reflected when it reaches the resist layer surface is also not negligible. If there are many kinds of light (incident light, reflected light, multi-reflected light) in a resist layer, this layer is exposed in accordance with the intensity distribution of composite light of all light components.

If an underlying substrate has a step structure, the thickness of a resist layer formed thereon changes so that the phase and intensity of reflected light in the resist layer vary. The distribution of amplitudes of standing waves in the resist layer therefore varies and the precision of resist pattern size lowers.

If the thickness of a resist film changes because of an uneven surface of the underlying substrate, the amplitudes of standing waves in the resist layer varies and the resist pattern precision lowers. In such a case, if reflection at the resist layer surface is reduced, the intensities of standing waves in the resist layer may be made uniform.

Basing upon this concept, techniques of forming an antireflection film on the surface of a resist film have been proposed. Such an antireflection film is called a top antireflection coating or film. For example, the top antireflection film is formed on the surface of a resist layer to a thickness of $(\lambda/4n_a)$ by using material having a refractive index $n_a$ lower than the refractive index $n_r$ of the resist layer. This layer having a thickness of $(\lambda/4n_a)$ is a $\lambda/4$ plate having an optical length of $\lambda/4$ in the thickness direction (in this specification, an optical length may also be called an optical thickness). The $\lambda/4$ plate is used as a single layer antireflection film, and shows the maximum effects of antireflection at $n_a = (n_r)^{1/2}$.

Studies made by the present inventors indicate that even if a top antireflection film is formed on a resist layer to an optical thickness of $\lambda/4$ by using material having a refractive index smaller than that of the resist layer, the resist pattern size precision is not necessarily improved, but it may lower in some cases. If the underlying layer of the resist film is a transparent film in particular, the resist pattern size precision becomes likely to be worsened.

SUMMARY OF THE INVENTION

It is an object of the present invention to provide a method of manufacturing a semiconductor device capable of providing an excellent patterning size precision of a resist layer formed on the surface of a transparent or semitransparent layer on a high reflectivity surface of a semiconductor substrate.

According to one aspect of the present invention, there is provided a method of manufacturing a semiconductor device for patterning a semiconductor substrate by photolithography, the semiconductor substrate having a transparent or semitransparent layer having a high transmissivity relative to an exposure wavelength $\lambda$, and the transparent or semitransparent layer being formed on an underlying structure with a surface having a high reflectivity relative to the exposure wavelength $\lambda$, the method comprising the steps of: forming a resist layer having a refractive index $n_r$ and a thickness $d_r$ on the transparent or semitransparent layer; forming a top antireflection film having a refractive index $n_a$ and a thickness $d_a$ on the resist layer; selectively exposing the resist layer via the top antireflection film with light having the exposure wavelength $\lambda$; removing the top antireflection film; and developing a latent image in the resist layer to form a resist pattern, wherein an optical thickness $n_a d_a$ of the top antireflection film and an optical thickness $n_r d_r$ of the resist layer are selected so that a size change in the resist pattern becomes small even if the thickness of the transparent or semitransparent layer changes. The method of manufacturing a semiconductor device provides an excellent size precision in patterning a semiconductor substrate having a transparent or semitransparent layer formed on a high reflectivity surface.

A resist layer is formed on a transparent or semitransparent layer formed on the surface of a semiconductor substrate, and a top antireflection film is formed on the resist layer. In this case, even if the optical thickness of the top antireflection film is set to $\lambda/4$, good results of exposure may not be obtained. However, if a sum of the optical thicknesses of the top antireflection film and resist layer is set in a range around a center value of $(\lambda/2)N+$(constant), good results are obtained. This fact was confirmed by experiments. The constant is $N \cdot p + 127$ under some conditions, where N is a positive integer or 0 and $p=(\lambda/2)$. This constant may be expressed as $N \cdot p + 127 = N \cdot p + 90 n_a = N \cdot p + 0.35\lambda$.

It is therefore possible to improve the size precision of photolithography of a semiconductor substrate having a transparent or semitransparent layer on the surface thereof.

DETAILED DESCRIPTION OF THE PREFERRED EMBODIMENTS

Figure 1A:
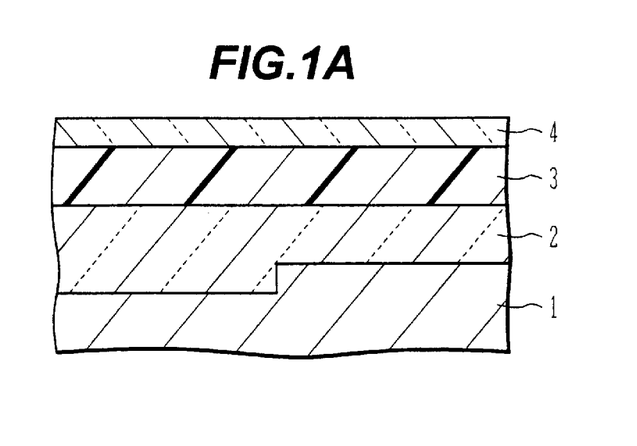
FIG. 1A is a cross sectional view showing the structure of a semiconductor device according to a fundamental embodiment of the invention.

Consider first the structure such as shown in FIG. 1A. In this example, on the surface of a high reflectivity substrate 1 having a step, a transparent layer 2 with a flat surface is formed. A high reflectivity substrate means a substrate having a high reflectivity surface of 0.2 or higher. The transparent layer 2 is, for example, a CVD oxide film formed by chemical vapor deposition (CVD). The surface of the transparent layer 2 is usually planarized. It is assumed that the high reflectivity substrate 1 has an irregular surface (step). On the surface of such a semiconductor substrate, a resist layer 3 is coated and a top antireflection film 4 is formed on the resist layer 3. The transparent layer 2 is not required to be a perfectly transparent body of light absorption-free. A transparent or semitransparent layer having a transmittance of 0.2 or higher in the total film thickness is called a transparent layer in this specification.

The top antireflection film 4 prevents reflection at the surface of the resist layer 3. According to conventional techniques, it is said that if the optical thickness of the top antireflection film 4 is set to ¼ the exposure wavelength ($\lambda$/4), reflection at the surface of the resist layer 3 can be lowered and the standing waves in the resist layer 3 are reduced.

However, the present inventors have found that if the transparent layer 2 is formed under the resist layer 3 as shown in FIG. 1A, good results are not always obtained even if the optical thickness of the top antireflection film 4 is set to ($\lambda$/4). In order to examine this reason, the inventors performed the experiments and simulations described in the following.

Figure 2A:
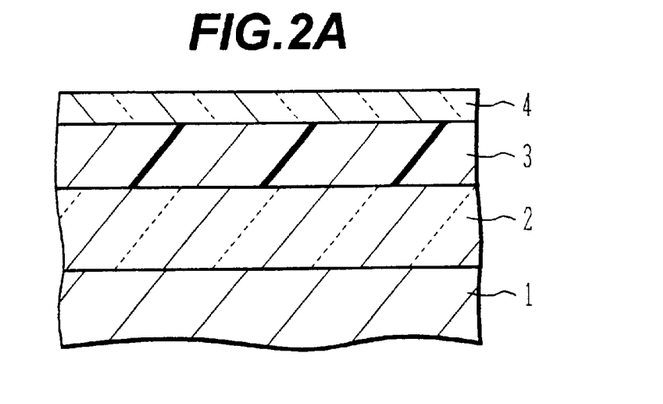
FIG. 2A is a cross sectional view showing a sample structure used by experiments made by the present inventors.

FIG. 2A shows the structure of samples used in the experiments. On the surface of a high reflectivity substrate 1 made of a bare silicon wafer, a CVD oxide film 2 was formed. On the surface of the CVD oxide film 2, a resist film 3 was coated, on which a top antireflection film 4 was formed.

CVD oxide films 2 of different thicknesses were prepared. If the pattern size of the resist layer changes with a thickness of the CVD oxide film 2 formed on a substrate having a transparent layer with uneven thickness, the size precision of photolithography worsens.

The refractive index of the CVD oxide film 2 was $n_r=1.47$. The resist layer 3 was made of positive resist (PFI-32 manufactured by Sumitomo Chemical Co. Ltd., Japan). The refractive index of the resist layer 3 was $n_r=1.65$, and its extinction coefficient was $k_r=0.029$. The top antireflection film 4 was made of AZ AQUATAR (tradename, available from Cloriant, Japan) having a refractive-index $n_a=1.41$.

AZ AQUATAR is transparent material made of at least one type of polysaccharide selected from a group consisting of alginate salt, sodium alginate salt, potassium alginate salt, tetraethylammonium alginate salt, tetramethylammonium alginate salt, soluble starch, amylose, lichenin, glycogen, and Pullulan.

An exposure system having a numerical aperture of NA=0.57, a light source size of ($\sigma$) S=0.4 and an i-line with a wavelength of 365 nm was used to form a hole having a diameter of 0.36 $\mu$m in the resist layer. The resist layers 3 having thicknesses of 0.76 $\mu$m and 0.82 $\mu$m were prepared, some of them were formed with the top antireflection film 4 of 65 nm thick, and others were not formed with the top antireflection film.

Figure 2B:
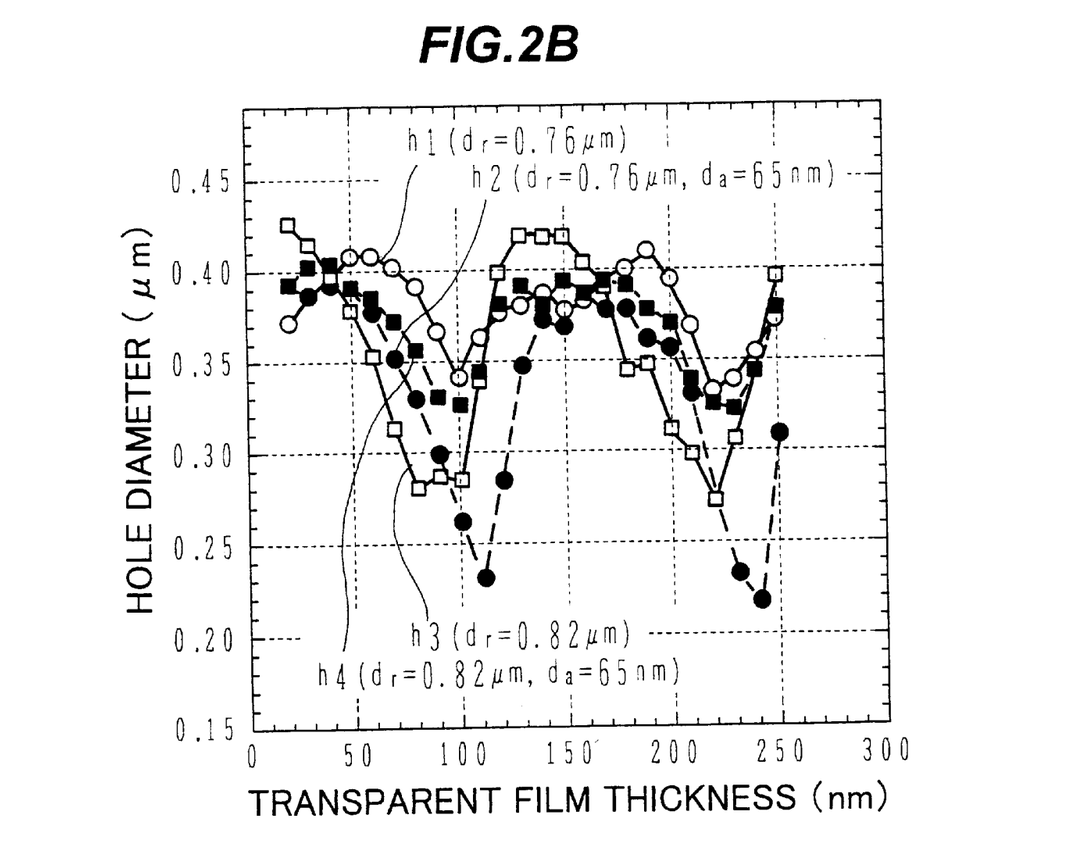
FIG. 2B is a graph showing the experiment results.

FIG. 2B is a graph showing the diameters of holes formed in the resist layer 3 at various thicknesses of the transparent layer made of a CVD oxide film as the underlying layer of the resist layer. The abscissa represents the thickness of the transparent layer in the unit of nm, and the ordinate represents a hole diameter in the unit of $\mu$m.

A curve h1 shows the experiment results using the resist layer having a thickness of $d_r=0.76$ $\mu$m without the top antireflection film. A curve h2 shows the experiment results using the resist layer having a thickness of $d_r=0.76$ $\mu$m with the top antireflection film of 65 nm thick. A curve h3 shows the experiment results using the resist layer having a thickness of $d_r=0.82$ $\mu$m without the top antireflection film. A curve h4 shows the experiment results using the resist layer having a thickness of $d_r=0.82$ $\mu$m with the top antireflection film of 65 nm thick.

The thickness of 65 nm of the top antireflection film corresponds to an optical thickness of about 91.7 nm and is about $\lambda$/4 of the exposure wavelength of 365 nm.

It is seen from this graph that all the curves change as a function of the transparent film thickness. Namely, if the transparent layer is present under the resist layer, the photolithography precision depends on this transparent layer.

With the top antireflection film 4 formed on the resist layer having a thickness $d_r$ of 0.76 $\mu$m, a change in the curve h2 was more than that in the curve h1 without the top antireflection film. Namely, provision of the top antireflection film worsened the size precision of photolithography.

With the top antireflection film 4 formed on the resist layer having a thickness $d_r$ of 0.82 $\mu$m, a change in the curve h4 was less than that in the curve h3 without the top antireflection film. Namely, provision of the top antireflection film having an optical thickness of $\lambda$/4 worked effectively for the resist film having a thickness of 0.82 $\mu$m.

The experiment results of FIG. 2B indicate that provision of the top antireflection film having an optical thickness of $\lambda$/4 on the surface of the resist layer over the transparent layer improves the precision of photolithography in some cases and worsens in other cases.

The experiment results of FIG. 2B may have some errors. For example, the thickness of the top antireflection film is determined on the assumption that the expected thickness is the same as that when a film of the same material is formed on a bare silicon wafer. However, it is not certain whether the expected film thickness is actually obtained if the top antireflection film is formed on the resist layer. In order to check this point, computer simulations were made under the same conditions.

Figure 3:
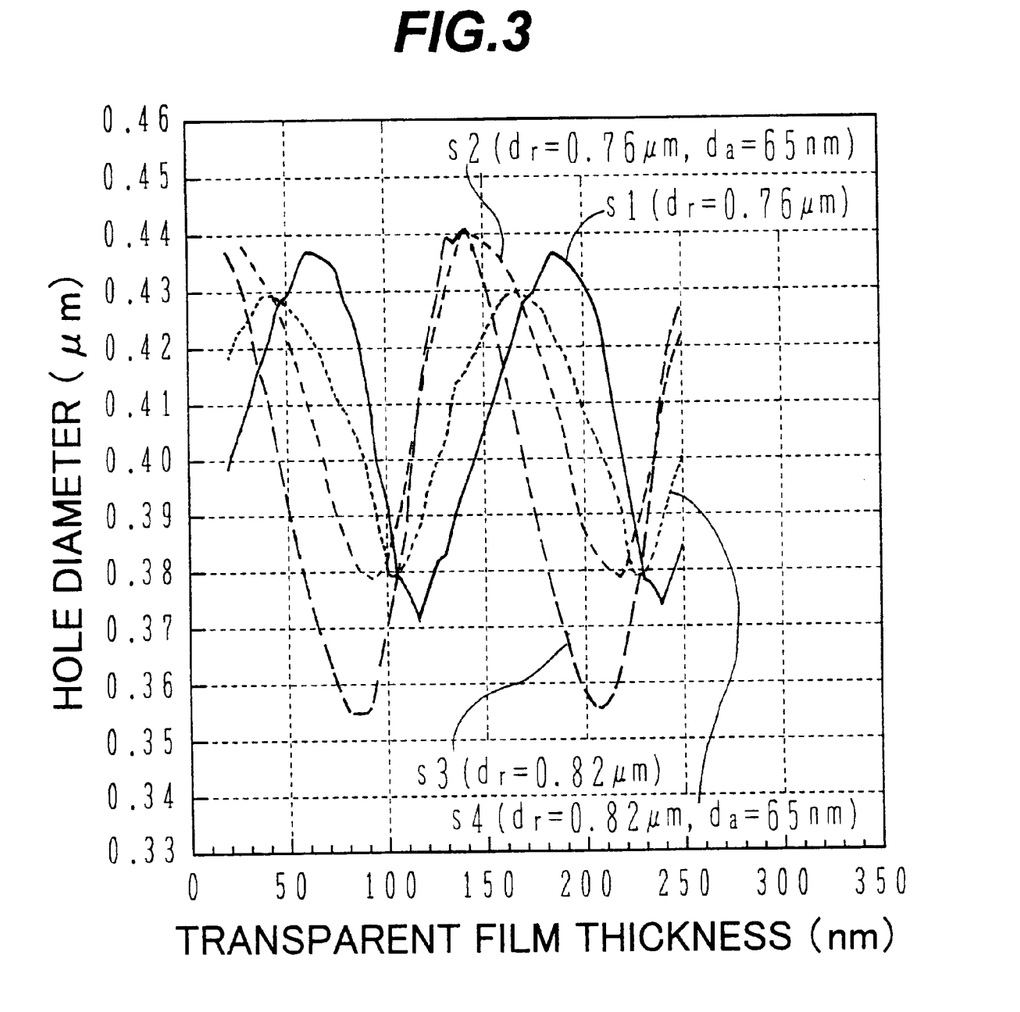
FIG. 3 is a graph showing simulation results obtained under the conditions equivalent to the experiments illustrated in FIGS. 2A and 2B.

FIG. 3 is a graph showing the results of computer simulations made under the same conditions given in FIG. 2B. Similar to FIG. 2B, the abscissa represents the thickness of the transparent layer in the unit of nm, and the ordinate represents a hole diameter in the unit of $\mu$m.

A curve s1 shows the simulation results using the resist layer having a thickness of $d_r=0.76$ $\mu$m without the top antireflection film. A curve s2 shows the simulation results using the resist layer having a thickness of $d_r=0.76$ $\mu$m with the top antireflection film of 65 nm thick. A curve s3 shows the experiment results using the resist layer having a thickness of $d_r=0.82$ $\mu$m without the top antireflection film. A curve s4 shows the experiment results using the resist layer having a thickness of $d_r=0.82$ $\mu$m with the top antireflection film of 65 nm thick. The curves s1 to s4 correspond to the curves h1 to h4 shown in FIG. 2B.

From the comparison of the simulation results shown in FIG. 3 with the experiment results shown in FIG. 2B, it is understood that there is very good coincidence therebetween from the qualitative point of view. Namely, with the top antireflection film formed on the resist layer having a thickness $d_r$ of 0.76 μm, a change in the curve s2 was not improved but rather worsened compared to that in the curve s1 without the top antireflection film. However, with the top antireflection film formed on the resist layer having a thickness $d_r$ of 0.82 μm, a change in the curve s4 was less than that in the curve s3 without the top antireflection film, and the photolithography precision was improved.

From the above results, it can be seen that the photolithography precision cannot be expected to be improved if the thickness of the top antireflection film 4 on the resist layer 3 formed on a thickness changing transparent layer 2 is simply set to ¼ the exposure wavelength λ. Further simulations were conducted for clarifying how conditions are to be selected in order to ensure stable effects of the top antireflection film.

Figure 4:
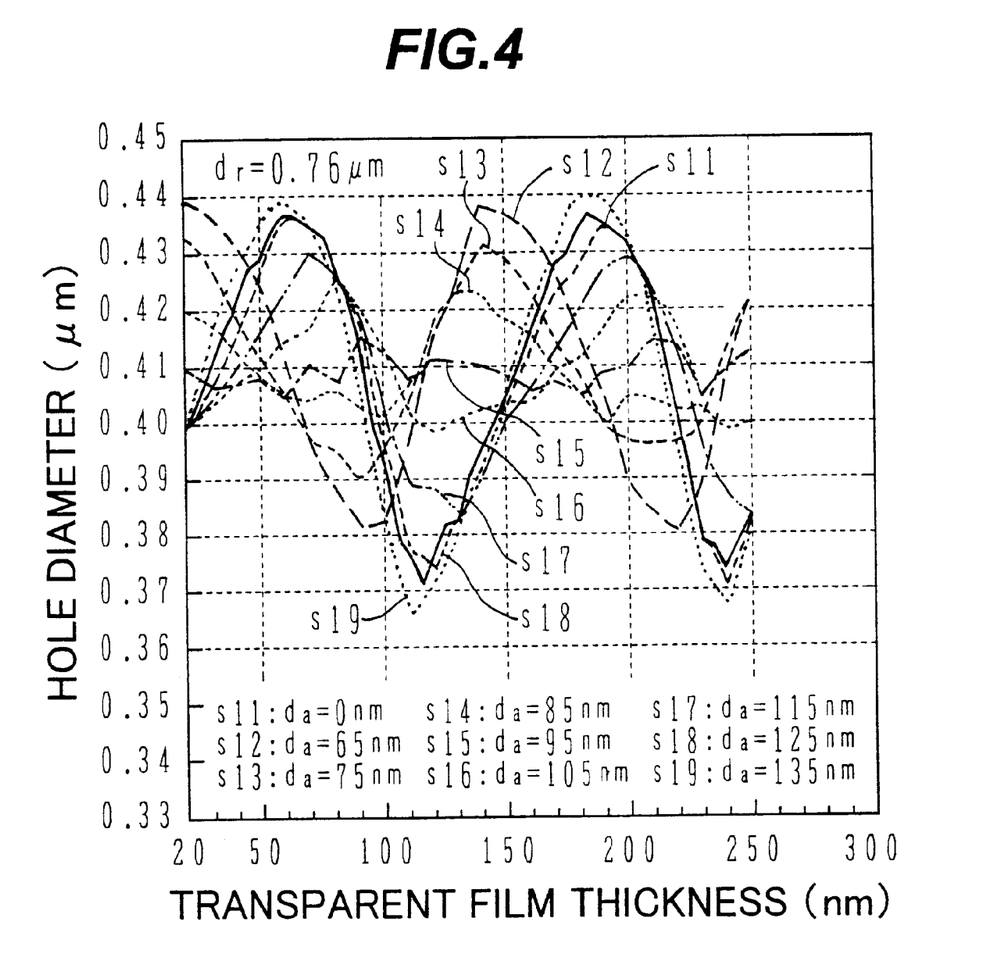
FIG. 4 is a graph showing changes in a resist pattern hole diameter relative to changes in a transparent film thickness, with the resist layer thickness being set to 0.76 μm.

FIG. 4 shows simulation results of hole diameters in a resist layer having a fixed thickness of $d_r$=0.76 μm on which a top antireflection film having a different film thickness is formed. A curve s11 shows the simulation results using the top antireflection film having a thickness $d_a$=0 nm (without the top antireflection film). A curve s12 shows the simulation results using the top antireflection film having a thickness $d_a$=65 nm. Similarly, curves s13 to s19 show the simulation results using top antireflection films with their thicknesses $d_a$ being changed from 75 nm to 135 nm at an increment step of 10 nm.

With the top antireflection film whose thickness is set to 65 nm corresponding to (λ/4), a change in the hole diameter is large and the effects of the top antireflection film are not provided. However, as the top antireflection film is increased in its thickness, a change in the hole diameter reduces. The curve s15 at the thickness $d_a$=95 nm of the antireflection film shows only a very small change in the hole. diameter. The thickness of the top antireflection film is therefore preferably set to $d_a$=95 nm for the resist layer having a thickness $d_r$=0.76 μm.

Figure 5:
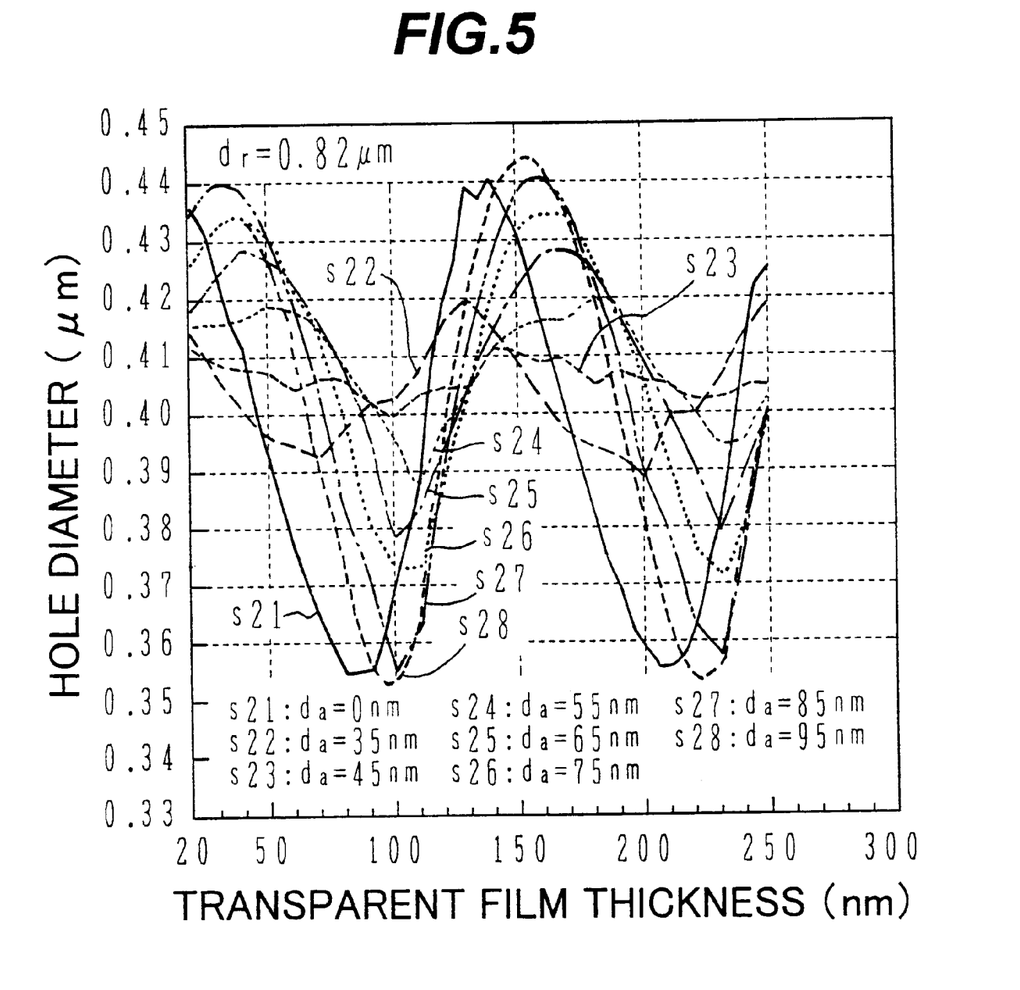
FIG. 5 is a graph showing changes in a resist pattern hole diameter relative to changes in a transparent film thickness, with the resist layer thickness being set to 0.82 μm.

FIG. 5 shows simulation results of hole diameters in a resist layer having a thickness of $d_r$=0.82 μm. A curve s21 shows the simulation results without using the top antireflection film ($d_a$=0 nm). Curves s22 to s28 show the simulation results using top antireflection films with their thicknesses $d_a$ being changed from 35 nm to 95 nm at an increment step of 10 nm. In this case, the curve s23 at the thickness $d_a$=45 nm of the antireflection film has the smallest change in the hole diameter. Namely, it is most preferable to form a top antireflection film having a thickness of about 45 nm on the resist layer having a thickness $d_r$=0.82 μm.

Figure 6:
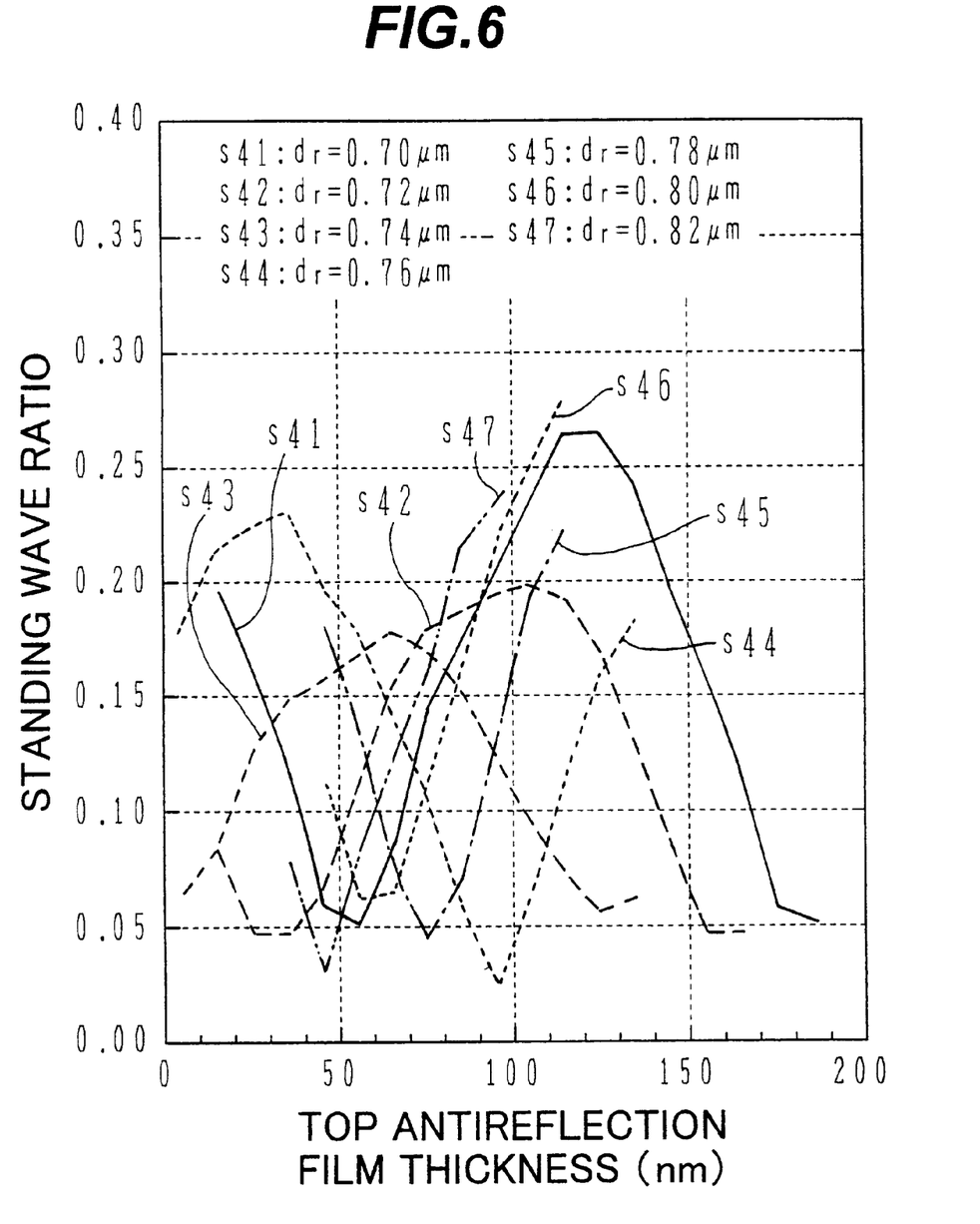
FIG. 6 is a graph showing changes in a standing wave ratio relative to changes in a top antireflection film thickness, using a resist layer thickness as a parameter.

FIG. 6 is a graph showing a change in the standing wave ratio in a resist layer relative to a change in a top antireflection film thickness, the graph being obtained through simulations and the resist layer thickness $d_r$ being used as a parameter. The abscissa represents a top antireflection film thickness in the unit of nm and the ordinate represents a standing wave ratio, which is the quotient obtained by dividing the (maximum-minimum) of the standing wave upon variation of the $SiO_2$ film thickness of more than one period by the central value of the standing wave. The thickness of the resist layer was changed from 0.70 μm to 0.82 μm at an increment step of 0.02 μm. Curves s41 to s47 show the simulation results using the resist layers whose thicknesses being changed from $d_r$=0.70 μm to 0.82 μm at an increment step of 0.02 μm.

The curve s44 for the resist layer thickness $d_r$=0.76 μm shows the minimum standing wave ratio at the top antireflection film thickness of 0.95 nm, which coincides with the results shown in FIG. 4. Similarly, the curve s47 for the resist layer thickness $d_r$=0.82 μm shows the minimum standing wave ratio at the top antireflection film thickness of about 0.45 nm, which also coincides with the results shown in FIG. 5. It can be understood that the smaller the standing wave ratio, the smaller the size change in photolithography.

As the resist layer thickness $d_r$ changes, the top antireflection film thickness showing the minimum standing wave ratio changes with the underlying transparent layer thickness. It can be known from the results shown in FIG. 6 that the thickness of the top antireflection film must be determined from the relation to the thickness of the underlying resist layer.

Optimum values of the top antireflection film were obtained for resist layers having different thicknesses.

Figure 1B:
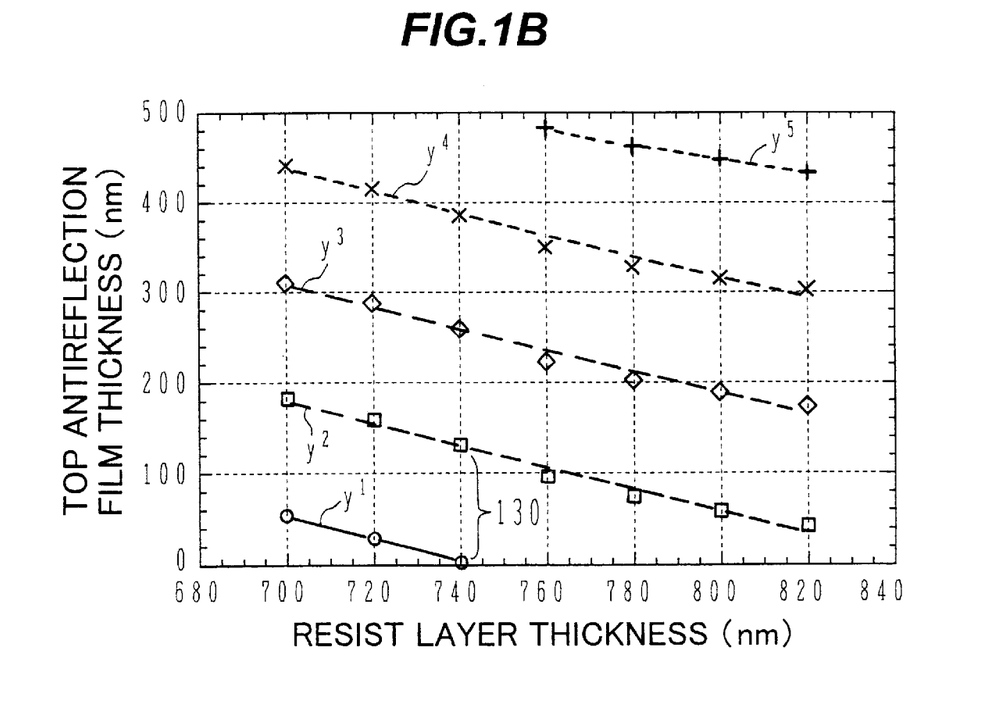
FIG. 1B is a graph showing the relationship between a resist film thickness and a top antireflection film thickness, which gives good results.

FIG. 1B is a graph showing optimum thicknesses of a top antireflection film relative to resist layers having different thicknesses. The abscissa represents a resist layer thickness in the unit of nm and the ordinate represents an optimum top antireflection film thickness in the unit of nm. In FIG. 1B, the area under solid straight lines y1 and y2 corresponds to the area verified also by the experiments, and the areas indicated by broken lines and dot lines correspond to the areas obtained through computer simulations.

As seen from FIG. 1B, the thickness of the top antireflection film showing the minimum standing wave ratio appears at a constant period at the same resist layer thickness. This period of the top antireflection film thickness is about 130 nm. It can be expected that the optimum resist layer thickness also appears periodically at the same top antireflection film thickness. The period of the resist layer thickness is about 110 nm.

As described earlier, the refractive index of the resist layer is $n_r$=1.65 and that of the top antireflection film is $n_a$=1.41. The period or pitch of the optimum values of the top antireflection film is given by using the optical thickness as:

$$n_a \times d_a = 1.41 \times 130 \approx 183 \text{ (nm)}$$

The period or pitch of the optimum values of the resist layer is given as:

$$n_r \times d_r = 1.65 \times 110 \approx 182 \text{ (nm)}$$

Representation by the optical thickness leads to a conclusion that the pitch of appearance of the optimum values of resist layer thicknesses is equal to the pitch of appearance of the optimum values of top antireflection film thicknesses. This pitch of about 182 (183) nm is about a half of the exposure wavelength of 365 nm. Namely, the optimum values appear every λ/2 of the optical thickness of the resist layer and top antireflection film. A pitch of the optical thickness p representing both the resist layer and top antireflection film is therefore equal to (λ/2).

The straight lines y1 to y5 shown in FIG. 1B can be expressed by:

$$n_a d_a = -n_r d_r + N \cdot p + 127 \text{ (nm)}$$

where N is a positive integer or 0. Substituting the refractive index $n_a$=1.41 of the top antireflection film and the exposure wavelength $n_a$=365 nm into the above equation, we obtain:

$$n_a d_a = -n_r d_r + N \cdot p + 90 n_a$$

$$= -n_r d_r + N \cdot p + 0.35 \lambda \text{ (nm)}$$

The optimum values of the thicknesses of the resist layer and top antireflection film are given by the above equation. However, other values slightly different from these optimum values can also provide the effects of the top antireflection film, as expected from the above-described experiment and simulation results. This range covers upper and lower ranges, each of about ¼ of the optimum value period. Therefore, the effects of the top antireflection film can be expected if the thicknesses of the resist layer and top antireflection film are selected in the range between:

$(n_a d_a + n_r d_r) = (\lambda/2)N + 90n_a +/- (\lambda/8)$ $= (\lambda/2)N + 0.35\lambda +/- (\lambda/8)$ where N is a positive integer or 0. Preferably, the ($\lambda/8$) is replaced with ($\lambda/16$), or more preferably it is replaced with ($\lambda/32$).

In the above experiments and simulations, the exposure wavelength of 365 nm was used. The experiment and simulation results may not vary even if the wavelength is changed so long as the optical property of a lamination structure does not change.

In the above experiments and simulations, the refractive index of the top antireflection film was $n_a=1.41$, that of the resist layer was $n_r=1.65$, and that of the transparent or semitransparent layer was $n_t=1.47$. Similar experiment and simulation results may be expected at different refractive indices if the relationship between them is maintained. For example, the refractive index $n_a$ of the top antireflection film may be 1.35 to 1.45, the index $n_r$ of the resist layer may be 1.60 to 1.70, and the index $n_t$ of the transparent or semitransparent layer may be 1.45 to 1.55.

If refractive indices are very different from those used for the above experiments and simulations although the above relationship is maintained, it is preferable to perform experiments and simulations again. With these experiments and simulations, the new optimum relationship between the optical thickness $n_a d_a$ of a top antireflection film and the optical thickness $n_r d_r$ of a resist layer is obtained while changing the thickness of a transparent or semitransparent film. In accordance with this relationship ensuring the good size precision of photolithography, the thicknesses of the top antireflection film and resist layer are determined.

Namely, in order to determine this new optimum relationship, samples are prepared by forming a transparent or semitransparent film on a high reflectivity surface and forming a resist layer and a top antireflection film thereon, while changing the thicknesses of these films and layer.

The resist layers on these samples are selectively exposed with light having a wavelength $\lambda$ through the top antireflection films. A change in the patterns formed in the resist layers is measured. If the pattern sizes are uniform even if the thicknesses of the transparent or semitransparent films are changed, the relationship obtained in this case is judged as the optimum relationship.

From these measurement results, the relationship between the optical thickness $n_a d_a$ of a top antireflection film and the optical thickness $n_r d_r$ of a resist layer is obtained, which maintains good size precision even if the thicknesses of the transparent or semitransparent layers are changed.

In accordance with the relationship obtained in the above manner, the thicknesses of the resist layer and top antireflection film are determined.

By incorporating such a manufacture method, photolithography with good size precision can be realized when a transparent or semitransparent layer is patterned even if its thickness is not uniform.

With reference to FIGS. 7A to 7F, a method of manufacturing a semiconductor device after the above-described preliminary steps are performed, will be described briefly.

Figure 7A:
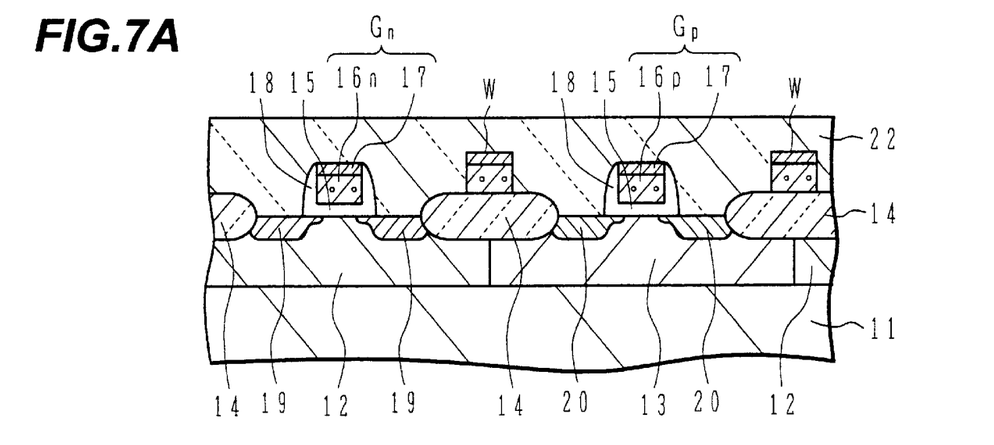
FIGS. 7A to 7F are cross sectional views illustrating a method of manufacturing a semiconductor device according to an embodiment of the invention.

As shown in FIG. 7A, a p-type well 12 and an n-type well 13 are formed in the surface layer of a silicon substrate 11 of, for example, a p-type. Thereafter, a field oxide film 14 is formed by well known local oxidation of silicon to define active regions. Gate oxide films 15 are formed on the active regions by thermal oxidation. On these gate oxide films 15, gate electrodes Gn and Gp are formed by laminating polysilicon layers 16n and 16p and silicide layers 17.

The polysilicon layers 16n and 16p contain respective n- and p-type impurities doped by independent ion implantation processes. After the gate electrodes Gn and Gp are patterned, shallow diffusion layers of an LDD structure are formed by independent ion implantation processes.

An oxide film is formed on the surface of the substrate by CVD or the like, and anisotropic etching is performed to form side spacers 18. Source/drain regions 19 and 20 are formed by independent ion implantation processes. Heat treatment for the activation of impurities is then performed. When the side spacers are formed or after the source/drain regions are formed through ion implantation, the gate oxide films in the active regions over the source/drain regions may be removed. In the above manner, a basic structure of a CMOS semiconductor device is formed. At the same time when the gate electrodes are formed, gate wiring patterns W are formed on the field oxide film 14.

After the CMOS structure is formed, an interlevel insulating film 22 of PSG, BPSG or the like is formed over the whole surface of the substrate. The surface of the interlevel insulating film 22 is planarized by a planarizing process such as a reflow process and a chemical mechanical polishing (CMP) process.

Figure 7B:
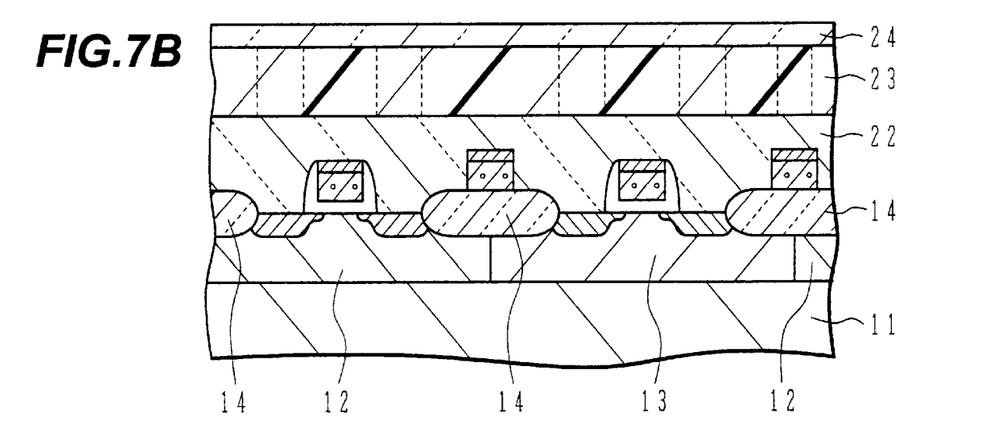

As shown in FIG. 7B, a resist layer 23 and a top antireflection film 24 are coated on the interlevel insulating film 22. The thicknesses of the resist layer 23 and top antireflection film 24 are set so as to have the optimum values determined by the above-described measurements.

At this stage, an exposure process is performed to form a latent image in the resist layer 23. Thereafter, the top antireflection film 24 is removed.

Figure 7C:
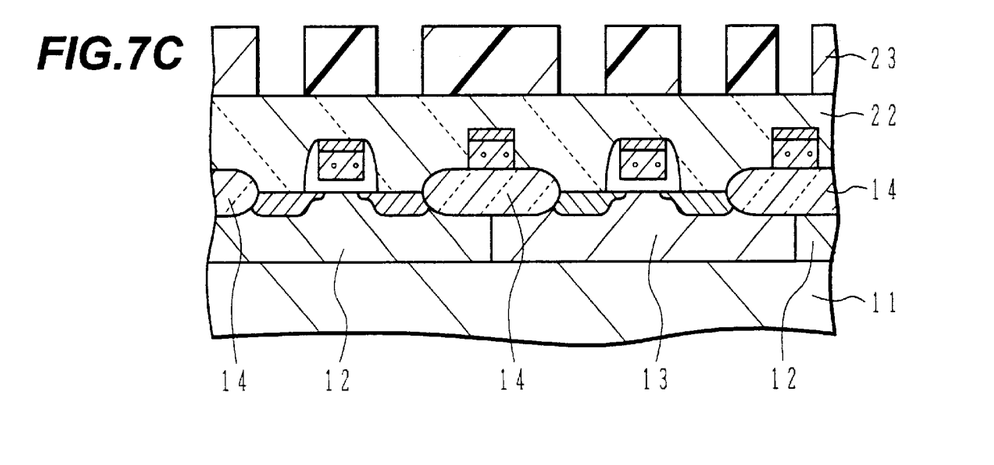

As shown in FIG. 7C, the resist layer 23 is developed to form a desired hole pattern. This hole pattern corresponds to holes to be formed later in the interlevel insulating film 22.

Figure 7D:
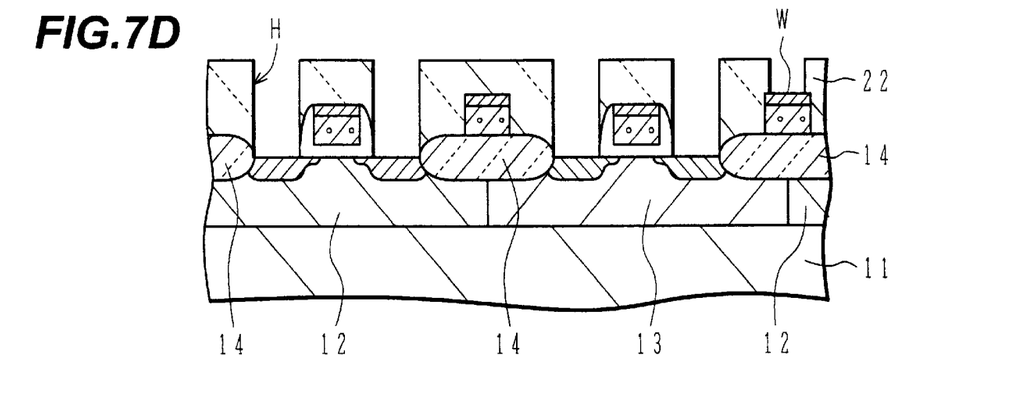

As shown in FIG. 7D, contact holes H are formed in the interlevel insulating film 22 at areas corresponding to the source/drain regions of CMOS transistors and the gate wiring W on the field oxide film.

Figure 7E:
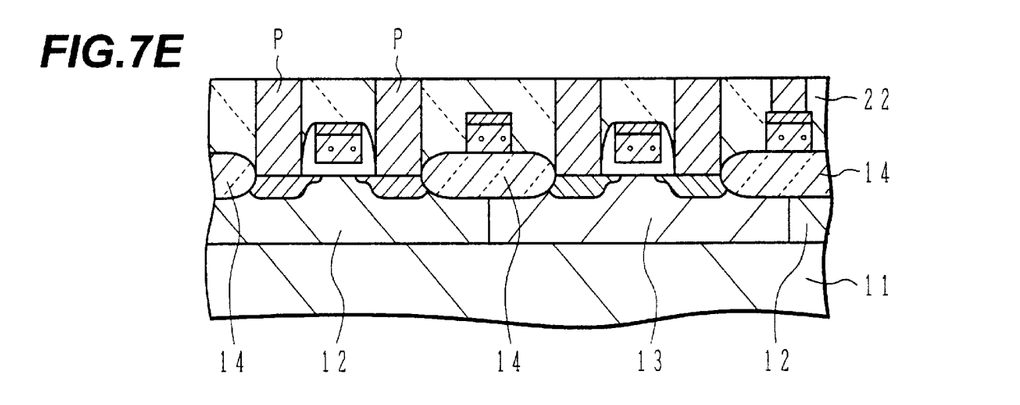

As shown in FIG. 7E, a conductive layer of tungsten (W), polysilicon, or the like is deposited over the whole substrate surface, and the surface of the conductive layer is planarized by etch-back, CMP or the like to leave conductive plugs P only in the contact holes.

Figure 7F:
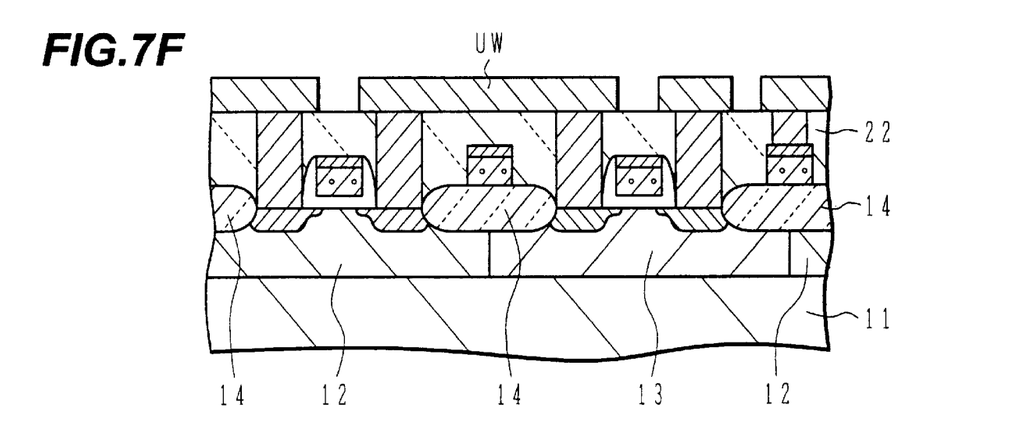

As shown in FIG. 7F, an upper wiring layer is formed on the substrate surface, and patterned by photolithography to form an upper wiring layer pattern UW.

Thereafter, if necessary, an interlevel insulating film covering the upper wiring layer pattern is formed, and contact holes are formed, and a wiring layer at a higher level is formed. Similar processes are repeated as many as the number of necessary wiring layers.

The present invention has been described in connection with the preferred embodiments. The invention is not limited only to the above embodiments. For example, the structure of a semiconductor device may be any type already known. If the above-described patterning method is used for the photolithography of a transparent or semitransparent layer exposed on the substrate surface, the patterning precision can be improved. It will be apparent to those skilled in the art that various modifications, improvements, combinations, and the like can be made.

What is claimed is:

1. A method of manufacturing a semiconductor device for patterning a semiconductor substrate by photolithography, the semiconductor substrate having a transparent or semitransparent layer having a high transmissivity relative to an exposure wavelength $\lambda$ in nm, and said transparent or semitransparent layer being formed on an underlying structure with a surface having a high reflectivity relative to the exposure wavelength $\lambda$, the method comprising the steps of:

forming a resist layer having a refractive index $n_r$ and a thickness $d_r$ in nm on said transparent or semitransparent layer;

forming a top antireflection film having a refractive index $n_a$ and a thickness $d_a$ in nm on said resist layer, the top antireflection film being positioned as an uppermost layer;

selectively exposing said resist layer via said top antireflection film with light having the exposure wavelength $\lambda$;

removing said top antireflection film; and developing a latent image in said resist layer to form a resist pattern, wherein an optical thickness $n_a d_a$ of said top antireflection film and an optical thickness $n_r d_r$ of said resist layer are selected so that pattern sizes are uniform even if the thickness of said transparent or semitransparent layer changes.

2. A method of manufacturing a semiconductor device according to claim 1, wherein said optical thicknesses $n_a d_a$ and $n_r d_r$ are selected in a range between $$(n_a d_a + n_r d_r) = (\lambda/2)N + Cn_a +/- (\lambda/8)$$

where N is a positive integer or 0 and C is a system constant.

3. A method of manufacturing a semiconductor device according to claim 2, wherein said system constant C is 90.

4. A method of manufacturing a semiconductor device according to claim 3, wherein said top antireflection film is made of at least one polysaccharide selected from a group consisting of alginate salt, sodium alginate salt, potassium alginate salt, tetraethylammonium alginate salt, tetramethylammonium alginate salt, soluble starch, amylose, lichenin, and glycogen.

5. A method of manufacturing a semiconductor device according to claim 3, wherein a refractive index $n_r$ of said resist layer is larger than refractive indices $n_a$ and $n_t$ of said top antireflection film and said transparent or semitransparent layer.

6. A method of manufacturing a semiconductor device according to claim 5, wherein the refractive index $n_a$ has a value from 1.35 to 1.45, the refractive index $n_r$ has a value from 1.60 to 1.70, and the refractive index $n_t$ has a value from 1.45 to 1.55.

7. A method of manufacturing a semiconductor device according to claim 3, wherein a refractive index $n_r$ of said resist layer is larger than refractive indices $n_a$ and $n_t$ of said top antireflection film and said transparent or semitransparent layer.

8. A method of manufacturing a semiconductor device according to claim 7, wherein the refractive index $n_a$ has a value from 1.35 to 1.45, the refractive index $n_r$ has a value from 1.60 to 1.70, and the refractive index $n_t$ has a value from 1.45 to 1.55.

9. A method of manufacturing a semiconductor device according to claim 1, wherein said optical thicknesses $n_a d_a$ and $n_r d_r$ are selected in a range between $$(n_a d_a + n_r d_r) = (\lambda/2)N + K\lambda +/- (\lambda/8)$$

where N is a positive integer or 0 and K is a system constant.

10. A method of manufacturing a semiconductor device according to claim 9, wherein said system constant K is 0.35.

11. A method of manufacturing a semiconductor device according to claim 1, wherein said top antireflection film is made of at least one polysaccharide selected from a group consisting of alginate salt, sodium alginate salt, potassium alginate salt, tetraethylammonium alginate salt, tetramethylammonium alginate salt, soluble starch, amylose, lichenin, and glycogen.

12. A method of manufacturing a semiconductor device according to claim 1, wherein the high reflectivity surface of the semiconductor substrate has a step and said transparent or semitransparent layer has a planarized surface.

* * * * *